FIG. I

INVENTOR.
HENRY M. HUGE
NEIL A. KAMMILLER
BY John Howard Smith

INVENTOR.
HENRY M. HUGE
NEIL A. KAMMILLER
BY John Howard Smith

INVENTOR.
HENRY M. HUGE
NEIL A. KAMMILLER
BY John Howard Smith

United States Patent Office 3,356,958

Patented Dec. 5, 1967

3,356,958

POWER BOOSTER INCLUDING A POWER AMPLIFIER FEEDBACK CIRCUIT

Neil A. Kammiller, North Olmsted, and Henry M. Huge, Bay Village, Ohio, assignors to Lorain Products Corporation, a corporation of Ohio Filed July 26, 1963, Ser. No. 297,743
13 Claims. (Cl. 330—26)

This invention relates to power increasers and is directed more particularly to an increaser in which power from an A-C source is added to that from associated amplifying means.

When it is necessary to increase the power of an alternating current power supply of the type which in itself has a relatively high power output, a number of problems are encountered. For example, if a 15 watt alternating current signal is to be fed into an amplifier designed to supply a 50 watt output, and the amplifier is to retain its overload characteristics, it will be seen that the input circuit components of the amplifier must be rated to handle the 15 watts at the amplifier input. Furthermore, the amplifier output transformer must be capable of supplying the 50 watt output. Under these circumstances the components utilized are not only expensive but are usually excessive in size.

Accordingly it is an object of the invention to provide improved circuitry in which the power of the alternating current generator and the power of the amplifier are combined at a point in the circuit beyond the source and beyond the amplifying components and then, as combined to provide the increased power, are fed directly to the load.

In many cases the alternating current generator, by the design of its own circuitry, is protected against short circuit. However, problems arise in that if the amplifier is not likewise protected against damage by short circuit, the generator-amplifier combination is not satisfactory. In order to maintain simplicity in the amplifier circuit and to greatly reduce circuit components, and as a further object of the invention there is provided herein an amplifier which, when associated with an A-C generator having short circuit protection, will assume the short-circuit proof characteristics of the generator.

It is still a further object of the invention to provide for an alternating current generator, amplifier circuitry which maintains the current limit and current cutback characteristics of the generator without requiring special or additional circuitry or connections.

It is still another object of the invention to provide circuitry in a device of the above character whereby the ratio between the power fed to the load by the amplifier and the power fed to the load by the generator is maintained constant regardless of varying load conditions.

It is a further object of the invention to provide amplifier circuitry which is adaptable for use with a variety of generators having a wide range of power capabilities.

Another object of the invention is to provide an amplifier circuit for use with an alternating current generator having means whereby the share of the increased load to be carried by the amplifier may be varied depending on the usage of the generator-amplifier combination.

It is still another object of the invention to provide circuitry which prevents the output voltage of the amplifier from dropping excessively with respect to the output voltage of its associated generator as current requirements of the load increase.

A still further object of the invention is to provide a circuit in which the flux produced by a generator and amplifier in a current coordinating transformer modifies the amplifier input voltage in a manner tending to reduce the flux to zero whereby the above mentioned predetermined ratio of the generator power to the amplifier power is maintained.

It is another object of the invention to provide an amplifier circuit wherein the output voltage of an A-C generator, a negative feedback voltage from the output of the amplifier and a voltage produced by the combined generator and amplifier currents are utilized to provide drive for a transistor power bridge. With such an arrangement, the predetermined ratio of generator and amplifier power, as modified to compensate for non-linear characteristics of the amplifier components, is fed to the load with precision.

It is still another object of the invention to provide, with an A-C generator, an amplifier circuit, the latter being connected in parallel to the generator in combination with power coordinating means whereby power from the generator and the amplifier are added and supplied to a load.

Other objects and advantages of the invention will become apparent from the accompanying description and drawings in which.

Figure 1:
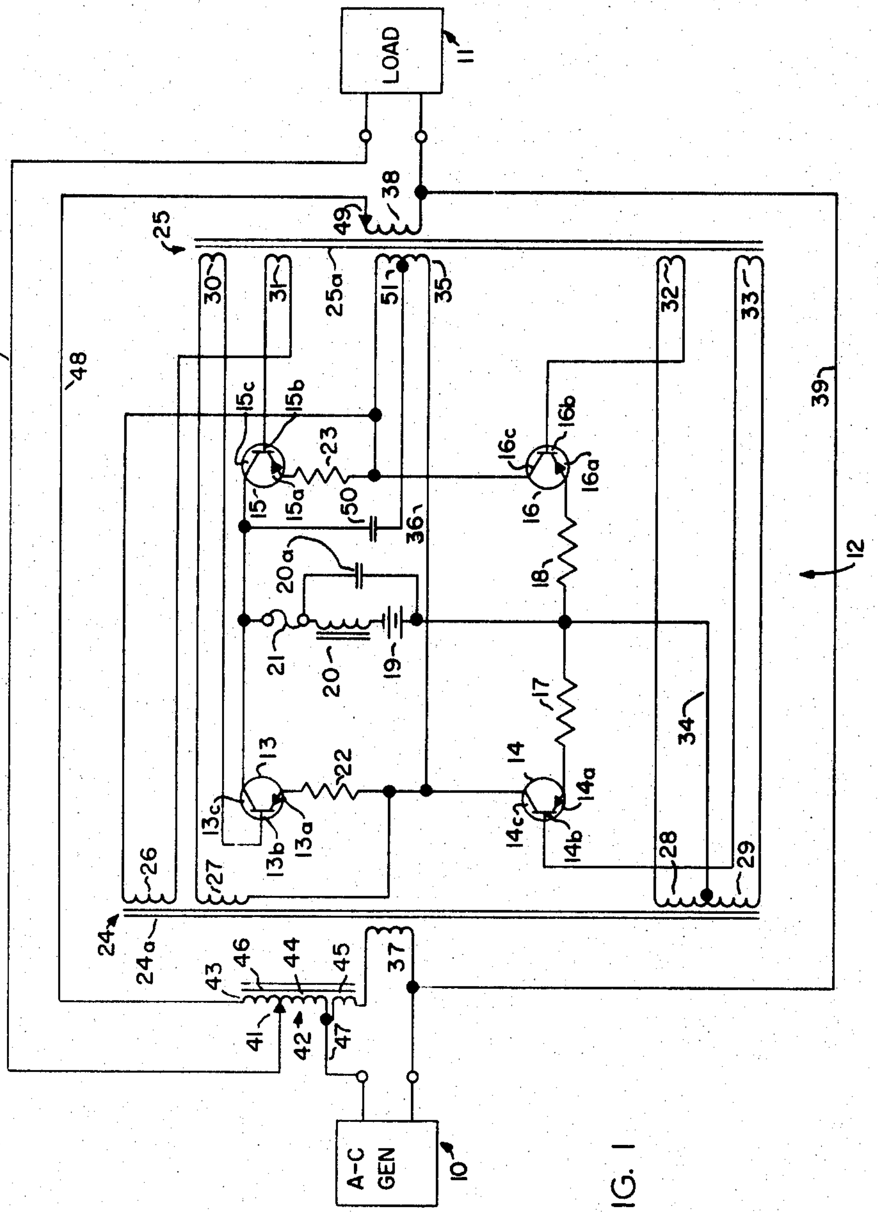
FIGURE 1 is a schematic diagram of a circuit embodying the invention.

Referring to FIGURE 1, circuitry exemplifying the invention may include an A-C generator 10, as for example a generator for supplying telephone ringing current, a suitable load 11 and power increasing means 12.

The power increasing circuit as shown herein is a power bridge configuration having transistors 13, 14, 15 and 16. As shown herein, these transistors are of the P-N-P type each having an emitter electrode, a base electrode and a collector electrode respectively designated as sub *a*, sub *b* and sub *c*. In order to form the bridge, emitter electrodes **14*a* and 16*a* are connected through respective current limiting resistors 17 and 18 to the positive pole of a battery 19. The negative side of the battery is connected through a filter choke 20 and associated capacitor 20*a* and a fuse 21 to the collector electrodes 13*c* and 15*c*, this arrangement serving to protect the transistors and to isolate amplifier noise from associated circuits. The power bridge connection between transistors is completed by the junction of emitter 13*a* with collector 14*c* through a suitable current limiting resistor 22 and by the junction of emitter electrode 15*a* with collector electrode 16*c* through suitable current limiting resistor 23**.

In order to provide proper drive voltage for transistors 13, 14, 15 and 16 an input transformer 24 and an output transformer 25 are provided. Transformer 24 has a core **24*a* provided with drive windings 26, 27, 28 and 29 while output transformer 25 has a core 25*a* provided with negative feedback windings 30, 31, 32 and 33**.

To the end that the transistor power bridge 12 will operate in accordance with the invention in a manner to be described presently, the upper end of drive winding 26 is connected to emitter **15*a* and the lower end thereof is connected to base electrode 15*b* through negative feedback winding 31; the lower end of drive winding 27 is connected to emitter 13*a* while the upper end is connected to base electrode 13*b* through negative feedback winding 30; the lower end of drive winding 28 and the upper end of drive winding 29 are connected to a common point between emitters 14*a* and 16*a* by a lead 34; the upper end of drive winding 28 is connected to base electrode 16*b* through negative feedback winding 32 while the lower end of drive winding 29 is connected to base electrode 14*b* through negative feedback winding 33**.

The operation of the power bridge is as follows. It will be seen that during the portion of the input cycle in which the lower ends of drive windings 26, 27, 28 and 29 are all positive, the base electrodes **13*b* and 16*b* will be negative with respect to emitter electrodes 13*a* and 16*a* of transistors 13 and 16, respectively. These transistors will then conduct, producing current flow from the positive side of the battery through a resistor 18, emitter-collector path of transistor 16, downwardly through a primary winding 35 provided on core 25*a* of transformer 25, through a lead 36, the emitter-collector path of transistor 13, the fuse 21 and the filter choke 20** to the negative side of the battery.

During the other half of the input cycle, the lower ends of the drive windings will be negative with respect to the upper ends and, therefore, transistors 13 and 16 will be turned off and transistors 14 and 15 will be rendered conducting causing current to flow from the positive side of the battery through a resistor 17, emitter-collector path of transistor 14, lead 36, primary winding 35, resistor 23, the emitter-collector path of transistor 15, fuse 21 and filter choke 20 to the negative pole of the battery. Thus, by having transistors 13 and 16 conduct simultaneously during one-half of the input cycle, with transistors 14 and 15 biased off and by having transistors 14 and 15 conduct together when transsistors 13 and 16 are nonconducting, an A-C current is developed in primary winding 35 of output transformer 25.

The negative feedback windings 30, 31, 32 and 33 are connected with their respective drive windings in such a manner that the voltages induced on the negative feedback windings from primary winding 35 oppose the voltages of the drive windings. The negative feedback thus provided preserves the sine wave signal and aids in regulating the amplifier output voltage as will be explained presently.

Driving power for the amplifying system is supplied to a winding 37 of input transformer 24 while output power is fed from the amplifier to the load from an output winding 38. Windings 37 and 38 serve as input means and output means respectively for the amplifier. To the end that source 10 may be connected to the load through the above described amplifier system, there is provided a common lead 39 arranged to connect one side of the primary winding 37 and one side of the source or generator through one side of the output winding 38 and one side of the load.

The other side of the generator is connected to the other side of the load by means of a lead 40 terminating in an adjustable tap 41 connected to the coil of a proportioning transformer or power coordinating and proportioning unit 42.

This power proportioning unit includes load proportioning winding sections 43 and 44 and a winding section 45 all wound on core 46. The winding section 45 functions as a secondary winding on proportioning unit 42 and serves as voltage developing means to compensate for proportioning changes as will be described presently. Winding section 43 may be termed the amplifier coil and the winding 44 may be termed the generator or source coil. Winding sections 43 and 44 also serve as flux generating magnetically coupled sections.

A lead 47 is provided to connect the upper end of coil 45 to the other terminal of the generator. The generator-amplifier connection is completed by a lead 48 having one end connected to coil 43 as shown and the other end terminating in an adjustable tap 49 on output winding 38. The adjustable tap 49 permits the amplifier output voltage to be selected to correspond to that of the particular A-C generator being used.

It will be seen that adjustable tap 41 determines the ratio of turns of winding section 43 to winding section 44. By setting tap 41 so that the ampere-turns of magnetizing force applied to core 46 by the rated amplifier current is equal to the ampere-turns of magnetizing force created by the rated generator current, the generator and amplifier each will supply a fixed proportion of the total load current. Since tap 41 may be adjusted to provide power proportioning between the generator and the amplifier, the amplifier circuitry may be used with any A-C generator having an output voltage within the adjustment range of tap 49.

From the foregoing circuitry, as will be pointed out presently in greater detail, the output current of an alternating current generator 10 and the output current of the amplifier 12 are combined in the proportioning means 42 before being supplied to the load 11. This combining of the generator and amplifier currents creates a flux in core 46 to produce a voltage on winding section 45. If the amplifier tends to carry more than its share of the current being delivered to the load, the voltage developed on winding section 45 by the flux in core 46 is of the polarity to oppose the input voltage from the A-C generator thereby decreasing the voltage at winding 37 and thus the input voltage to the amplifier in order to decrease its output current. If, on the other hand, the amplifier tends to furnish less than its share of load current, the voltage produced on winding section 45 will aid the input voltage from A-C generator 10 thus increasing the voltage across winding 37 and consequently the amplifier output to its proportionate share of the load current.

Because of the load sharing characteristics of the amplifier, it may be protected from damage due to excessive load current demands. For example, if the load requires more than the rated current of the generator-amplifier combination, the generator output voltage and current may be decreased or cut back by circuitry provided in the generator. Since the amplifier supplies a fixed proportion of the total load current, the amplifier output voltage and current also decrease when the generator output decreases thereby protecting the amplifier from damage.

The proportioning means 42, as aided by the negative feedback circuitry also serves to provide voltage regulation for the signal being fed to the load 11. If the A-C generator is provided with circuitry which maintains the output voltage relatively constant, it will be seen that as load 11 requires greater current, the output voltage of the A-C generator will remain constant but the output of the amplifier will tend to decrease due to resistance and non-linearity of the components therein. However, any tendency of the amplifier output voltage to decrease would reduce the amount of current delivered to the load 11 by the amplifier and therefore a flux would be generated in core 46 to develop a generator aiding voltage on winding section 45. In this manner, the load proportioning means substantially maintains the regulation of the signal being supplied to the load 11 if the A-C generator has a flat output voltage regulation characteristic.

Negative feedback windings 30, 31, 32 and 33 also aid in maintaining the output voltage regulation of the amplifier. The voltages on the negative feedback windings oppose those on the drive windings and therefore reduce the drive voltage applied to the transistors of the amplifier. Thus, if the amplifier output voltage drops due to losses in the amplifier components as the current requirements of load 11 increase, the voltage on the negative feedback windings 30, 31, 32 and 33 will also decrease thereby allowing increased drive to the transistors to increase the voltage on primary winding 35 and therefore the amplifier output voltage in a compensatory manner.

In addition to regulation of the output voltage of the amplifying system over the full range of load current requirements, the output voltage of the alternating current generator and of the amplifying system must be substantially equal at no load in order to prevent undesirable circulating currents from flowing through the power proportioning unit 42 and the output winding 38 of output transformer 25. Under this no load condition, lead 40 carries no current but a complete loop for current flow is formed through lead 39, the generator 10, lead 47, winding 44, winding 43, lead 48 and winding 38. If the generator voltage tends to be greater than the amplifier voltage under no load conditions, a flux will tend to be generated in core 46 by the tendency of current to flow in windings 43 and 44 to produce a voltage on winding section 45. This would increase the input voltage delivered to the amplifier by the generator and the winding 45 since the voltage across the winding 45 increases. Such action will increase the output voltage of the amplifier until it is substantially equal to the generator voltage. Any tendency of the amplifier voltage to exceed the generator voltage will produce a flux in core 46 and a resultant voltage on winding section 45, causing the input voltage on the amplifier to decrease. When the amplifier and generator output voltages are substantially equal, the flux in core 46 will be essentially zero and the input voltage of the amplifier appearing on input winding 37 will be equal to the output voltage of the source. Accordingly it will be seen that with this arrangement and with output tap 49 the generator and amplifier output voltages are maintained equal under no load conditions to prevent undesirable circulating currents and accompanying losses from occurring.

Considering the amplifying system at an instant of time when the upper terminal of A-C generator 10 is positive with respect to its lower terminal, current will flow through the lead 47, winding section 44 and lead 40 to load 11 returning to the generator through a lead 39. At the same time, current will flow from the generator through lead 47, winding section 45 and input winding 37 of the amplifier then returning to generator 10.

Current flow downwardly through input winding 37 causes the lower ends of the drive windings 26, 27, 28 and 29 to be positive with respect to the upper ends thereof thus causing transistors 13 and 16 to conduct and causing current to flow downwardly in primary winding 35. The resulting voltage induced on output winding 38 causes current to flow from adjustable tap 49 through lead 48, winding section 43 and lead 40 to the load 11. The current returns to the lower end of output winding 38 from the lower terminal of load 11.

The amplifier current traversing winding 43 applies a magnetizing force on core 46 while the source or generator current flowing through winding section 44 applies opposing magnetizing force. If the ampere-turns of magnetizing force produced by the generator current is equal to the ampere-turns of magnetizing force generated by the amplifier current, the resultant flux in core 46 will be zero and consequently no voltage will be developed on winding section 45. However, this is an ideal case, since as explained previously, the output voltage of the amplifier, being unregulated, tends to decrease faster than the generator voltage as load current demand increases whereby the generator tends to supply more than its share of the load current.

Considering again the instant of time when the upper terminal of generator 10 is positive with respect to the lower terminal, if the flux created in core 46 is the result of a magnetizing force produced by a generator current which is greater than the magnetizing force produced by the amplifier current, a potential will be induced on winding section 45. This causes the upper end of winding 45 to be positive with respect to the lower end thereof. Because of this polarity on winding section 45, it acts as a source of voltage which is series aiding to the output voltage of the A-C generator 10 and therefore increases the voltage on input winding 37 of the amplifier. This increased voltage increases the conduction of transistors 13 and 16 so that increased current is delivered to load 11 from output winding 38. As a result of the increased amplifier current, greater amplifier magnetizing force will be produced on core 46 to oppose the A-C generator magnetizing force. The voltage on winding section 45 will continue to increase the amplifier input, and consequently its output current, until the generator magnetizing force and the amplifier magnetizing force on core 46 are essentially equal whereupon significant voltage will no longer be induced on winding section 45 since the load sharing condition has been attained.

It will be understood that on the alternate half cycle of the generator output when the upper terminal of the generator is negative with respect to the lower terminal as viewed in the drawings, transistors 14 and 15 will conduct, transistors 13 and 16 being biased off, and current will flow in opposition through winding sections 43 and 44. Accordingly it will be seen that the source and generator current combine at adjustable tap 41 and the combined current flows through lead 40.

Due to what may be termed a switching effect, one or the other of the conducting pair of transistors of power bridge 12 may turn fully on as they approach saturation. Each time this switching effect occurs, the potential on the mid-point of the primary winding 35 is changed causing distortion of the amplifier output. To the end that this momentary change of potential in primary winding 35 may be prevented, a capacitor 50 is connected between a mid-point tap 51 on winding 35 and collector electrode **15*c* of transistor 15**.

From the foregoing it will be seen that we have provided an amplifier which, in an additive manner, supplies a fixed proportion of the total current being delivered to a load by the amplifier and its associated generator. In addition, the amplifier output voltage regulation characteristic is approximately as good as that of the generator. Also, if the generator output cuts back under overload conditions, the amplifier output voltage and current will likewise decrease to a safe value.

Figure 2:
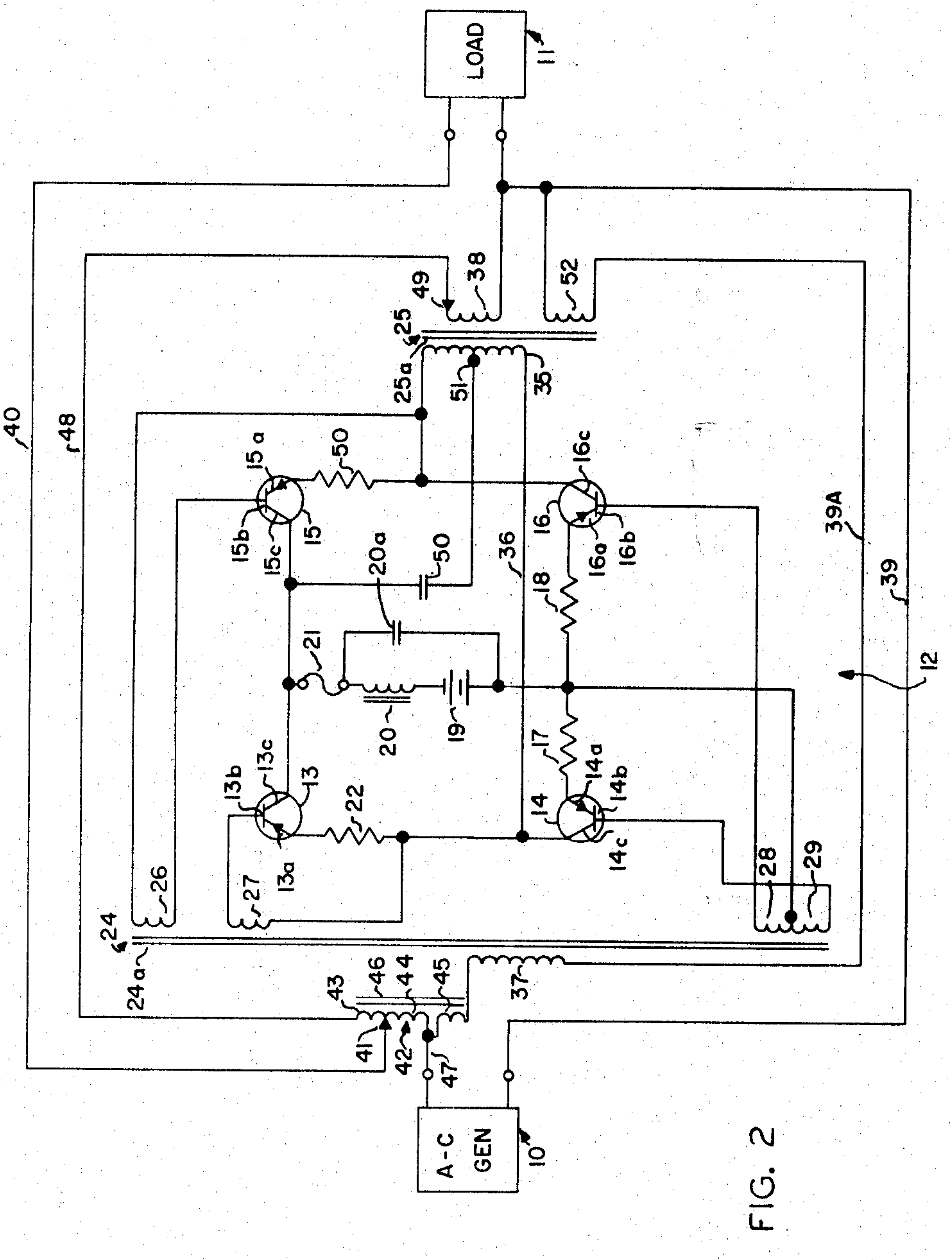
FIGURE 2 is a schematic diagram of a circuit showing the invention modified with respect to the negative feedback components and, FIGURE 3 is a schematic drawing of a further modification of the invention.

The amplifier system shown in the modification of FIGURE 2 is in many respects similar to that shown in FIGURE 1 and like parts are identified by like numerals. One feature of the circuit of FIGURE 2 is the arrangement of a negative feedback winding with the amplifier input winding so the voltage impressed on the input winding is reduced by the magnitude of the voltage appearing on the negative feedback winding. This reduced voltage and the accompanying decrease of power in the primary winding permits the input transformer to be greatly reduced in size. To this end the lower terminal of input winding 37 as viewed in FIGURE 2 is connected to the lower terminal of the alternating current generator 10 through a lead **39*a* and negative feedback winding 52 which is provided on core 25*a* of output transformer 25. This arrangement of the negative feedback eliminates the plurality of negative feedback windings 30, 31, 32 and 33 required in FIGURE 1. It will be seen that the voltage on negative feedback winding 52 opposes the voltage on input winding 37. Thus, the full generator output voltage does not appear on input winding 37, since it is reduced by the magnitude of voltage on negative feedback winding 52. This arrangement permits a substantial reduction in the size of input transformer 24 due to the reduced voltage and power which input winding 37** must handle.

Figure 3:
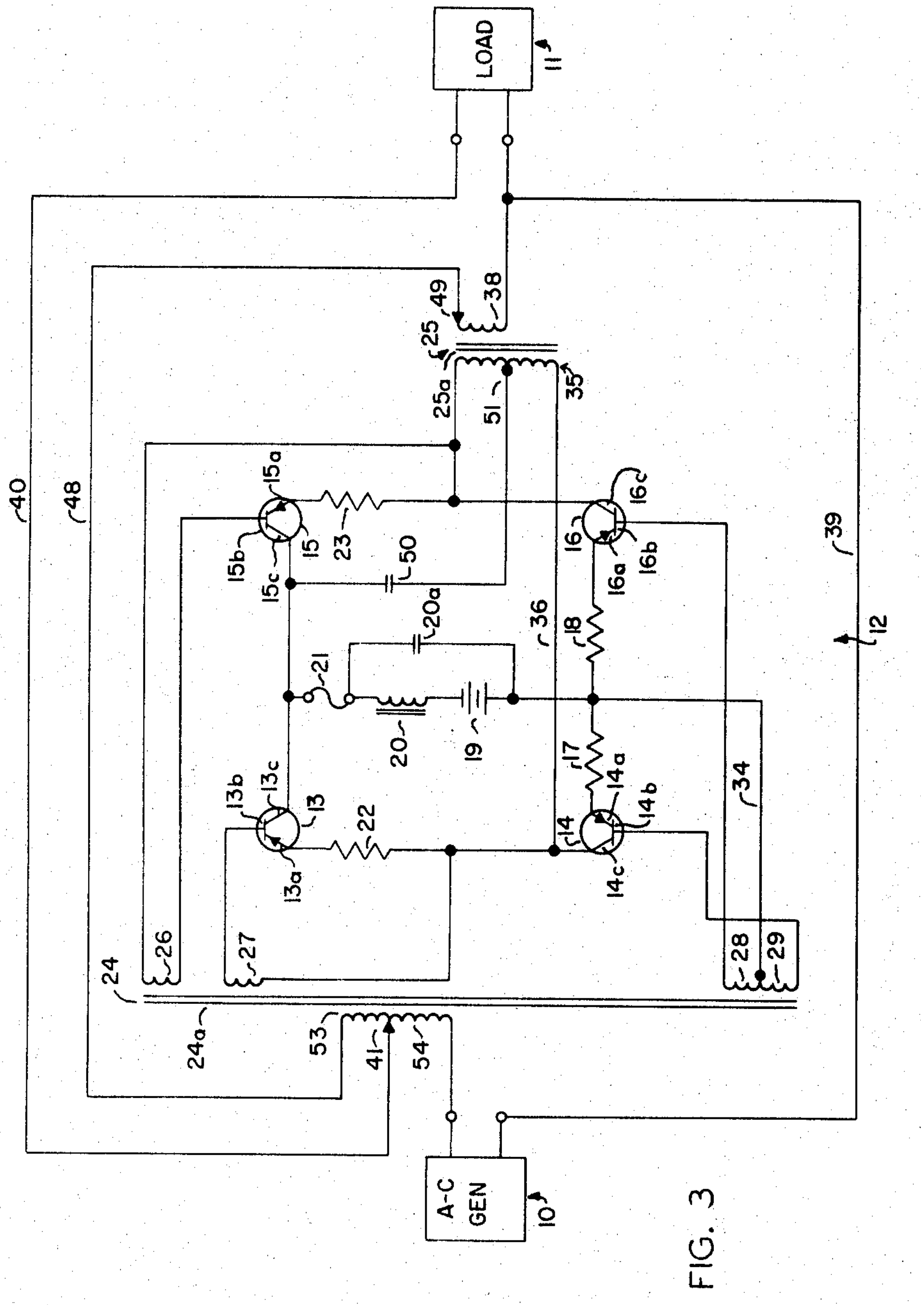

The circuit of the modification of FIGURE 3, like that of FIGURE 2, is in many respects similar to FIGURE 1 and like parts are similarly identified by the like numerals. It will be noted that in this embodiment, the winding section 45 and the input winding 37 of the arrangement shown in FIGURES 1 and 2 have been eliminated and winding sections 53 and 54 which replace the winding sections 43 and 44 respectively of FIGURES 1 and 2, are wound directly on the core **24*a* of input transformer 24**.

With this arrangement, it is desirable for the ampere-turns of magnetizing force generated by current through winding section 54 to exceed the ampere-turns of magnetizing force resulting from amplifier current flowing through winding section 53. This domination of generator flux in core **24*a*** induces voltage on the drive windings and thereby drives the bridge transistors in the desired manner.

The negative feedback in the circuit of FIGURE 3 results from the opposition of the magnetizing force produced on core 24a by the amplifier current flowing through winding section 53 to the driving magnetizing force created by generator current traversing winding section 54. Because the magnetizing force produced by generator current in winding section 54 is slightly greater than that produced by amplifier current in winding section 53, voltage is induced on the drive windings to drive the transistors as explained previously.

The generator and amplifier load sharing function of the modification of FIGURE 3 is derived from the coaction of the magnetizing force produced by the amplifier and generator currents traversing winding sections 53 and 54 respectively. If the amplifier tends to carry more than its share of the load, the amplifier produced magnetizing force on core 24a will increase. Since this magnetizing force opposes that from winding 54, the drive to the transistors will be decreased thereby decreasing the output of the amplifier to its proper share. Should the generator tend to supply more than its share of the load current, the magnetizing force on core 24a will increase, and the drive for the transistors and consequently the output current of the amplifier will increase until the proper load sharing is attained.

Flow of undesirable circulating currents through windings 53, 54, and 38 in the circuit of FIGURE 3 under a no load condition is prevented by maintaining the generator and amplifier output voltages substantially equal to one another as in the circuits of FIGURES 1 and 2. Any variation from this equality changes the amplifier driving flux in core 24a and modifies the amplifier output voltage until it is substantially equal to the generator voltage.

It will be understood that the embodiments shown herein are for explanatory purposes and may be changed or modified without departing from the spirit and scope of the invention as set forth in the claims appended hereto.

What we claim is:

1. In an additive amplifier circuit for an alternating current generator, the combination of an amplifier having drive means and output means, current coordinating means inductively associated with said drive means, means for directing load current from the alternating current generator and load current from said output means of said amplifier in opposition through said current coordinating means, means for electrically connecting said coordinating means to the load, the net effect of the alternating generator current and the amplifier output current in said current coordinating means controlling the voltage on the drive means of the amplifier.

2. In a power increasing circuit for connecting an A-C source to a load to increase the power supplied to the load to a value greater than the rated output of said source wherein the source output is combined with the increasing circuit output and said combined outputs are maintained in predetermined proportion and fed in said predetermined proportion to the load, in combination, an amplifier having input means, means for connecting one side of the source, one side of the amplifier and one side of the load in common, current coordinating means electrically associated with said amplifier input means, said current coordinating means comprising an inductor, said inductor having one end connected to the other side of the source and the other end connected to the other side of the amplifier, electrical connecting means between an intermediate point of said inductor and the other side of the load to define current conducting inductor segments each for respectively directing current flow from the source and the amplifier in opposition through respective segments in proportions according to the position of said intermediate point on said inductor.

3. In a power increaser circuit for connecting an A-C source to a load to increase the power supplied to the load to a value greater than the rated output of said source, in combination, an amplifier, means for connecting one side of the source, one side of said amplifier and one side of the load in common, current coordinating means having a plurality of magetically coupled sections arranged to generate magnetizing force when current passes therethrough, means for connecting one end of one of said sections and one end of another of said sections to the other side of said load, means for connecting the other side of the source to the other end of said first named section and means for connecting the other side of the amplifier to the other end of said last named section.

4. In a power increasing circuit adapted to supply a load, a fixed proportion of the current being supplied to the load by an associated A-C generator, in combination, an amplifier having drive means and output means, current coordinating means electrically connected with said drive means, means providing for the flow of generator current and amplifier current between the generator and the amplifier respectively and the load in opposition through said current coordinating means, means for connecting a portion of the output voltage of said amplifier output means in opposition to the drive voltage of said amplifier to regulate the voltage on said drive means in accordance with variations in the output voltage of said amplifier.

5. In a power increasing circuit adapted to supply to a load a fixed proportion of the current being supplied to the load by an associated A-C generator, in combination, an amplifier having drive means and output means, current coordinating means electrically associated with said drive means, negative feedback winding means electrically coupled with said output means, means for electrically connecting said feedback winding means to said drive means, means providing for the flow of generator current and amplifier current between the generator and the amplifier respectively in opposition through said current coordinating means and through the load, means for connecting said negative feedback winding means to said drive means whereby the net effect of the A-C generator current and the amplifier output current in said current coordinating means and the responsive voltage on the negative feedback winding means controls the energization of the drive means of the amplifier.

6. In a power increaser circuit for use with an A-C power source and a load, in combination, an amplifier having input and output means, current coordinating means, voltage developing means responsive thereto, means providing for the flow of amplifier current and power source current between the power source and the amplifier outputs respectively and the load through said current coordinating means, the respective currents developing opposing effects in said current coordinating means, the net difference between said opposing effects serving to develop a voltage across said voltage developing means, means for connecting said voltage developing means to said amplifier input to regulate said input in accordance with the net difference between said opposing effects.

7. In a power increaser circuit for use with an A-C power source and load, in combination, an amplifier having input and output transformers each provided with primary and secondary winding means, a negative feedback winding on said output transformer, current coordinating means including first and second load proportioning windings and voltage developing means responsive thereto, means for connecting one side of said source, one end of said negative feedback winding, one end of the secondary of said output transformer and one side of the load in common, means for connecting the other end of said negative feedback winding to one end of the primary winding of said input transformer; means for connecting the other end of said primary winding of said input transformer to one end of said voltage developing means; means for connecting the other end of said voltage developing means, one end of said first load proportioning winding and the other side of the source in common;

means for connecting the other end of said first load proportioning winding, one end of said second load proportioning winding and the other side of the load in common, and means for connecting the other end of said second load proportioning winding to the other end of said output winding.

8. In a power increaser circuit for use with an A-C generator and a load, in combination, an amplifier having an input transformer and an output transformer, each provided with primary and secondary windings, a negative feedback winding on said output transformer, current coordinating means comprising first, second and third winding sections, means for connecting said first winding section, said primary winding of said input transformer and said negative feedback winding in series across the generator output, means for establishing current flow between the generator and the load through said second winding section, means for establishing current flow between a secondary winding of said output transformer and the load through said third winding section whereby the voltage induced on said first winding section by the generator and amplifier currents in said second and third winding sections respectively, with the voltage on said negative feedback winding, controls the voltage on said primary winding of said input transformer of the amplifier to modify the drive thereof in accordance with variations in the output of the amplifier.

9. In a power increasing circuit adapted to supply a fixed proportion of the current being supplied to a load by said circuit and an associated A-C generator, in combination, an amplifier having input drive means and output means, said input drive means including a primary winding and secondary drive winding means, said output means including negative feedback winding means connected in series with respective drive winding means, a primary winding and an output winding; amplifying means electrically connected to said primary winding to supply power thereto, said negative feedback winding means and said drive winding means being electrically connected in phase opposition with respect to one another, means for connecting one side of the generator, one side of the load, one end of said primary winding of said input drive means and one end of said output winding in common, current coordinating means including first and second load proportioning windings and a voltage developing means responsive thereto, means for connecting one end of said voltage developing means to the other end of said primary winding of said input drive means; means for connecting the other end of said voltage developing means, one end of said first load proportioning winding and the other side of said generator in common; means for connecting the other end of said first load proportioning winding, one end of said second load proportioning winding and the other side of the load in common; and means for connecting the other end of said second load proportioning winding to the other end of said output winding.

10. In a power increaser for use with an A-C source and a load to increase the power fed to the load to an amount exceeding the rated output of the A-C source, in combination, an amplifier, current coordinating means and negative feedback means, said current coordinating means including a plurality of magnetically coupled windings, a first of which is arranged to conduct source current between the source and the load, a second of which is arranged to conduct amplifier current between the amplifier and the load in opposition to source current in said first winding and a third arranged to respond inductively to changes from a predetermined proportion between source current and amplifier current, input and output transformer means in said amplifier, primary and secondary windings on said input and output transformers, said third winding and said negative feedback means being arranged to modify the input voltage on said primary winding of said input transformer to control the amplifier drive in accordance with changes in amplifier output resulting from changes in generator output and load requirements or from non-linear characteristics of circuit components.

11. In a power increaser for use with an A-C source and a load to increase the power fed to the load to an amount exceeding the rated output of the A-C source, in combination, an amplifier, current coordinating means, and negative feedback means, said current coordinating means including a plurality of magnetically coupled windings, a first of which is arranged to conduct source current between the source and the load, a second of which is arranged to conduct amplifier current between the amplifier and the load in opposition to source current in said first winding and a third arranged to respond inductively to changes from a predetermined proportion between source current and amplifier current, input means including drive means for the amplifier, output means for the amplifier including said negative feedback means, said third winding and said negative feedback means being arranged to modify the drive of said amplifier, said drive means and said negative feedback means being arranged to have opposing polarities whereby the amplifier drive is modified, the modification of the input voltage and the drive being provided in accordance with changes in amplifier output resulting from changes in generator output and load requirements or from non-linear characteristics of circuit components.

12. In a power increaser for use with an A-C source and a load to increase the power fed to the load to an amount exceeding the rated output of the A-C source, in combination, an amplifier having input and output transformers, secondary windings on said input transformer comprising amplifier drive windings, current coordinating means in primary relationship to said input transformer including inductively coupled winding sections, a firsts of said winding sections being arranged to conduct source current between the source and the load, a second of said winding sections being arranged to conduct amplifier current between the amplifier and the load in opposition to source current in said first winding section whereby the amplifier current opposes the source current, the magnitude by which the magnetic force of said first winding exceeds that of said second winding providing drive voltage on said amplifier drive windings.

13. In a power increasing circuit for connecting an A-C source to a load to increase the power supplied to the load to a value greater than the rated output of said source wherein the source output is combined with the increasing circuit output and said combined outputs are maintained in predetermined proportion and fed in said predetermined proportion to the load, in combination; an amplifier having input and output transformers, secondary windings on said input transformer comprising amplifier drive windings, current coordinating means in primary relationship to said input transformer including inductively coupled winding sections, a first and a second of said winding sections serially connected between the source and generator outputs whereby any current flow between the source and the amplifier under a no load condition produces a magnetizing force which modifies the amplifier drive and thereby the output voltage to minimize the current flow.

References Cited

UNITED STATES PATENTS

| | | | |
|---|---|---|---|
| 2,793,246 | 5/1957 | Olive et al. | 330—69 X |
| 2,860,241 | 11/1958 | Post | 330—69 X |
| 2,957,126 | 10/1960 | Wright | 324—99 X |
| 3,051,912 | 8/1962 | Kaashoek et al. | 330—69 |

ROY LAKE, *Primary Examiner.*

NATHAN KAUFMAN, *Examiner.*